United States Patent
Sedor et al.

(10) Patent No.: US 11,204,474 B2
(45) Date of Patent: *Dec. 21, 2021

(54) UNIVERSAL EXPANDABLE CABLE MANAGEMENT BRACKET

(71) Applicant: Panduit Corp., Tinley Park, IL (US)

(72) Inventors: Thomas M. Sedor, Orland Park, IL (US); Joseph E. Sanders, Elwood, IL (US)

(73) Assignee: Panduit Corp., Tinley Park, IL (US)

(*) Notice: Subject to any disclaimer, the term of this patent is extended or adjusted under 35 U.S.C. 154(b) by 23 days.

This patent is subject to a terminal disclaimer.

(21) Appl. No.: 16/822,919

(22) Filed: Mar. 18, 2020

(65) Prior Publication Data

US 2020/0218024 A1 Jul. 9, 2020

Related U.S. Application Data

(63) Continuation of application No. 16/441,734, filed on Jun. 14, 2019, now Pat. No. 10,606,011.

(60) Provisional application No. 62/687,437, filed on Jun. 20, 2018.

(51) Int. Cl.
| | |
|---|---|
| *G02B 6/44* | (2006.01) |
| *F16L 3/127* | (2006.01) |
| *F16M 13/02* | (2006.01) |

(52) U.S. Cl.
CPC .......... *G02B 6/4452* (2013.01); *F16L 3/127* (2013.01); *F16M 13/02* (2013.01)

(58) Field of Classification Search
CPC .......... G02B 6/26; G02B 6/4452; F16L 3/127; F16M 13/02
USPC .................................................. 385/134–139
See application file for complete search history.

(56) References Cited

U.S. PATENT DOCUMENTS

| | | |
|---|---|---|
| 5,571,256 A | 11/1996 | Good et al. |
| 5,833,337 A | 11/1998 | Kofstad |
| 6,079,677 A | 6/2000 | Daoud |
| 6,435,462 B2 | 8/2002 | Hawes |
| 6,578,939 B1 | 6/2003 | Mayer |
| 6,666,340 B2 | 12/2003 | Basinger et al. |
| 6,736,277 B2 | 5/2004 | Lauchner et al. |
| 6,863,188 B2 | 3/2005 | Besserer et al. |
| 7,188,916 B2 | 3/2007 | Silvestro et al. |
| 7,281,694 B2 | 10/2007 | Allen et al. |
| 7,330,629 B2 | 2/2008 | Cooke et al. |
| 7,694,926 B2 | 4/2010 | Allen et al. |
| 7,699,279 B2 | 4/2010 | Chen et al. |
| 7,857,145 B2 | 12/2010 | Mushan et al. |
| 7,945,136 B2 | 5/2011 | Cooke et al. |
| 7,974,105 B2 | 7/2011 | Dean, Jr. et al. |
| 8,033,621 B2 | 10/2011 | Liang |

(Continued)

*Primary Examiner* — Michael P Mooney
(74) *Attorney, Agent, or Firm* — Christopher S. Clancy; James H. Williams; Aimee E. McVady

(57) ABSTRACT

A cable management bracket that routes cables in a cabinet or rack. The cable management bracket includes an inner mounting rail and an outer mounting rail. The outer mounting rail is secured to the inner mounting rail by fasteners. The inner mounting rail has a top flange, first and second end flanges, a bottom flange, and a side surface. The outer mounting rail has a top flange, an end flange, a bottom flange, and a side surface. The side surfaces of the inner mounting rail and the outer mounting rail have a plurality of mounting features for securing bundling clips that receive a plurality of cables.

15 Claims, 17 Drawing Sheets

(56) References Cited

U.S. PATENT DOCUMENTS

| | | |
|---|---|---|
| 8,040,693 B2 | 10/2011 | Blomquist |
| 8,083,298 B2 | 12/2011 | Henderson et al. |
| 8,104,626 B2 | 1/2012 | Huang et al. |
| 8,353,489 B2 | 1/2013 | Phelan et al. |
| 8,356,718 B2 | 1/2013 | Yang |
| 8,411,465 B2 | 4/2013 | Dean, Jr. et al. |
| 8,437,147 B2 | 5/2013 | Dean, Jr. et al. |
| 8,437,597 B2 | 5/2013 | Cooke et al. |
| 8,538,227 B2 | 9/2013 | Cowen et al. |
| 9,348,104 B2 | 5/2016 | Thijs et al. |
| 9,402,470 B2 | 8/2016 | Shen et al. |
| 9,538,844 B2 | 1/2017 | Chen et al. |
| 9,629,276 B2 | 4/2017 | Sampath et al. |
| 9,635,937 B2 | 5/2017 | Shen et al. |
| 9,699,935 B1 | 7/2017 | Marrs et al. |
| 9,817,202 B2 | 11/2017 | Thijs et al. |
| 9,861,197 B2 | 1/2018 | Chen et al. |
| 9,872,414 B2 | 1/2018 | Eberle, Jr. et al. |
| 10,606,011 B2 * | 3/2020 | Sedor .................. G02B 6/4452 |
| 2004/0227441 A1 | 11/2004 | Wang et al. |
| 2006/0113433 A1 | 6/2006 | Chen et al. |
| 2009/0078834 A1 | 3/2009 | Chen et al. |
| 2010/0085726 A1 | 4/2010 | Blomquist |
| 2011/0211329 A1 | 9/2011 | Dean, Jr. et al. |
| 2016/0215904 A1 * | 7/2016 | Chen ........................ H02G 3/32 |
| 2018/0049341 A1 * | 2/2018 | Chen ........................ H02G 3/32 |

* cited by examiner

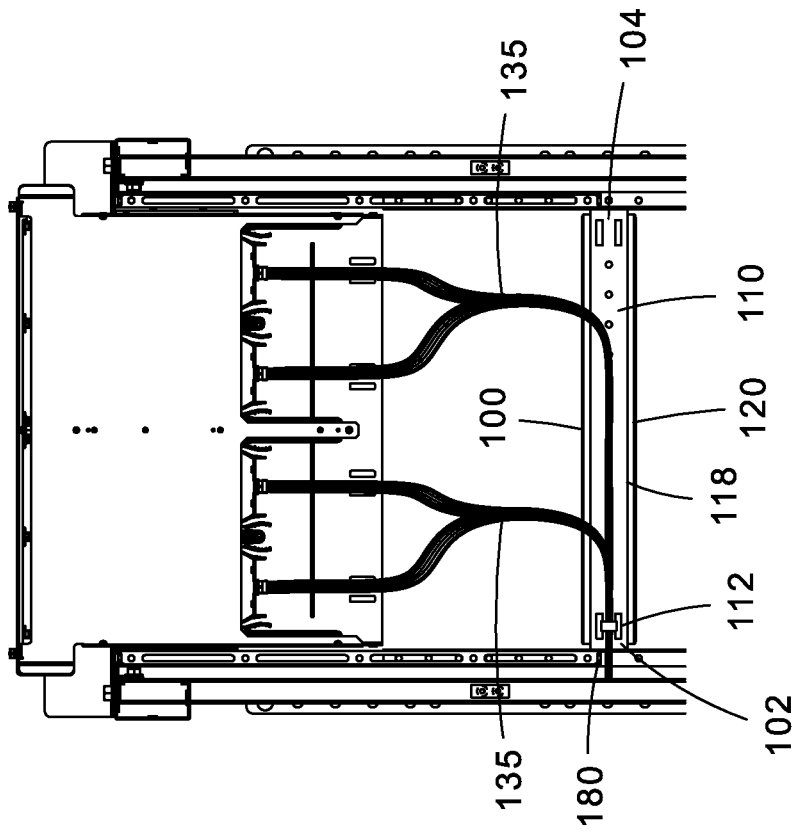
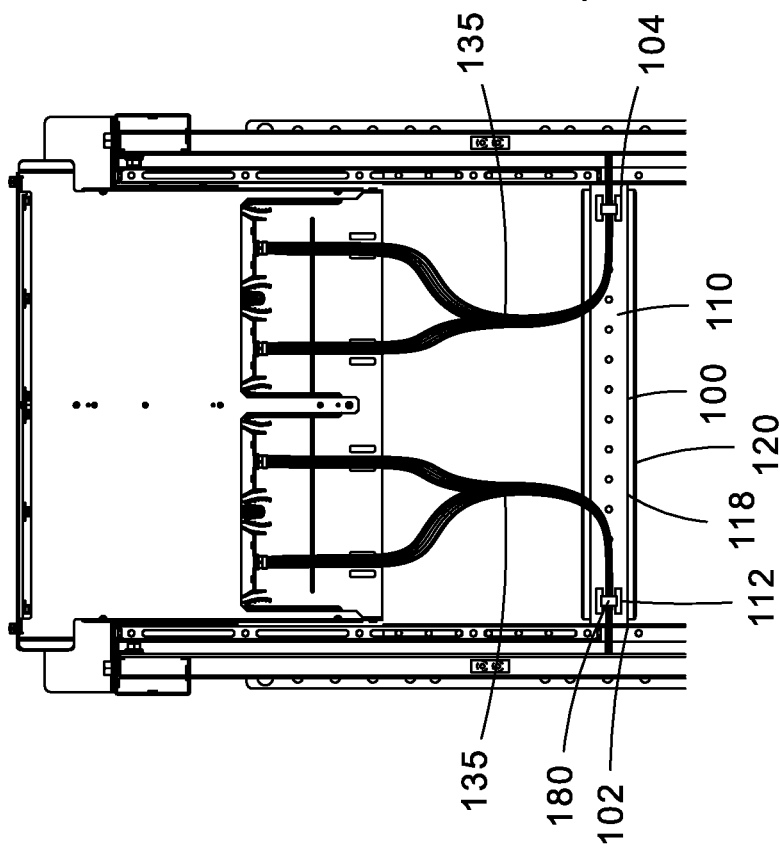

UNIVERSAL EXPANDABLE CABLE MANAGEMENT BRACKET

CROSS REFERENCE TO RELATED APPLICATION

This application is a continuation of U.S. patent application Ser. No. 16/441,734, filed Jun. 14, 2019, which issued as U.S. Pat. No. 10,606,011, on Mar. 31, 2020, and claims priority to U.S. Provisional Application No. 62/687,437, filed Jun. 20, 2018, the subject matter of which is hereby incorporated by reference in its entirety.

FIELD OF THE INVENTION

The present invention relates to a cable management bracket, and more particularly to a universal expandable cable management bracket.

BACKGROUND OF THE INVENTION

It is known to secure cables inside cabinets or racks by various methods. Brackets holding cabling are mounted to the rear fixed rail of 4-post racks or the moveable vertical rail (i.e., equipment rail) of a cabinet. The brackets are typically used for improved management of fiber cabling and to secure the weight of the cables.

Unfortunately, the rear movable vertical rails or equipment rails in a cabinet are positioned at various locations in the cabinet. The rear fixed vertical rails of a 4-post rack can have multiple depths. Since the rear mounting rails in 4-post rack or cabinet are so variable, it may not be possible to secure the cable brackets in a position that is conducive for optimal cable management or to support the cable weight to reduce stress on the fibers.

Cable management plates are known to support fibers along the rear of the enclosure. However, if multiple 1 RU enclosures are stacked on top of each other, the size and surface area of the cable management plate can make it difficult to reach into the rear of an enclosure to access cassettes or cabling.

Additionally, cable transitions secured to enclosures may induce undesirable forces across the rear of the enclosure that may deflect the enclosure downward, may use up critical space at the rear of the enclosure in high density applications, and can make it difficult to route a rigid cable within the limited space behind an enclosure.

Thus, it would be desirable to provide a solution that enables clips or brackets to be mounted at any location inside cabinets or a 4-post rack for cable management.

SUMMARY OF THE INVENTION

A cable management bracket has been designed to route cables in a cabinet or rack. The cable management bracket includes an inner mounting rail and an outer mounting rail adjustably secured to the inner mounting rail. The inner mounting rail has a top flange, first and second end flanges, a bottom flange, and a side surface. The outer mounting rail has a top flange, an end flange, a bottom flange, and a side surface. The side surface of the inner mounting rail has a plurality of mounting features for securing bundling clips that receive a plurality of cables. The side surface of the outer mounting rail also has a plurality of mounting features to secure bundling clips that receive a plurality of cables.

BRIEF DESCRIPTION OF THE DRAWINGS

FIG. 14A is a top view of cables routed to the sides and secured to a strain relief bracket at a rear.

FIG. 14B is a top view of cables routed to one side and secured to a strain relief bracket at a rear.

DETAILED DESCRIPTION

Figure 1:
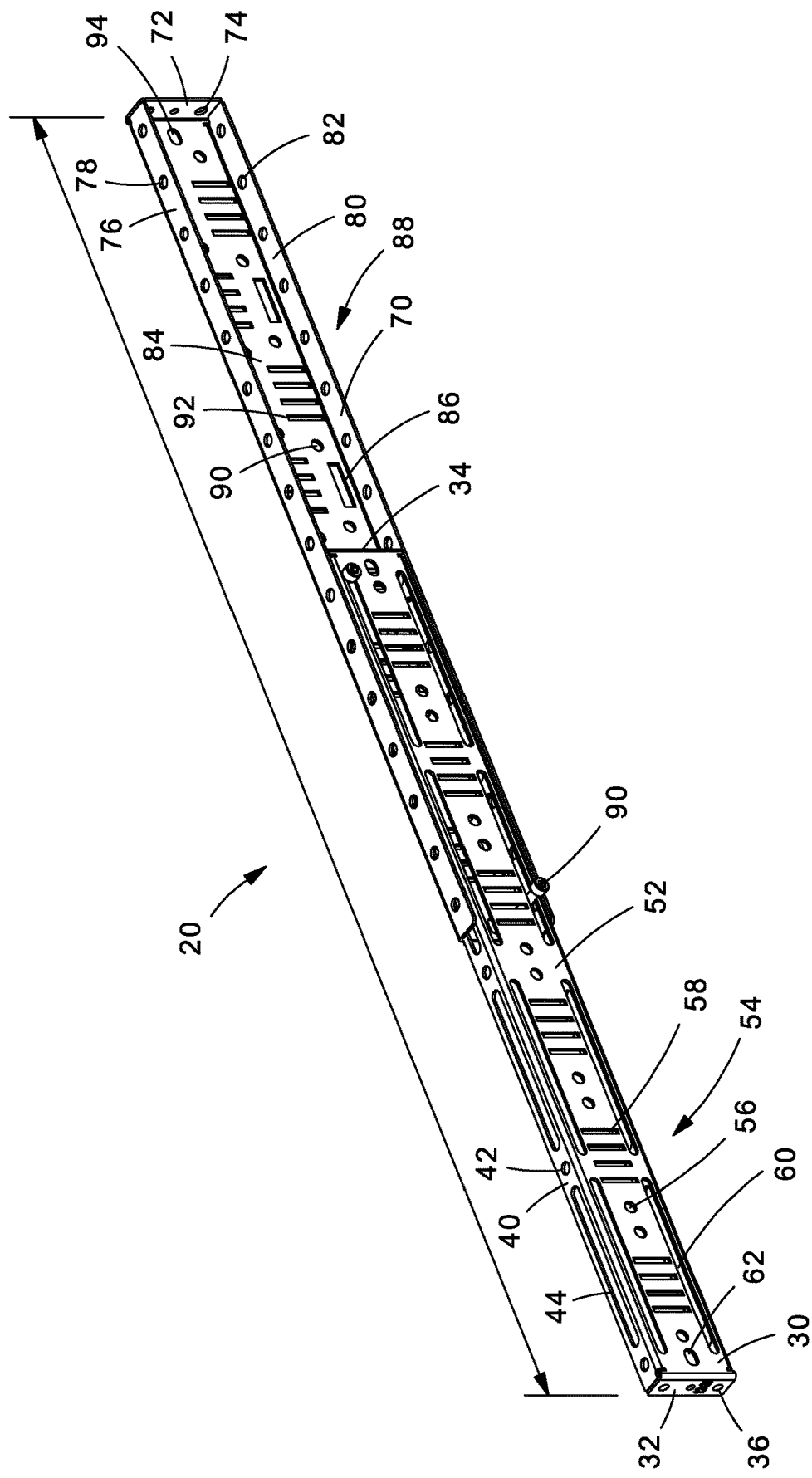
FIG. 1 is a perspective view of the cable management bracket of the present invention in an expanded position.

FIG. 1 is a perspective view of the cable management bracket of the present invention. The cable management bracket 20 is comprised of a single front or inner mounting rail 30 and a single rear or outer mounting rail 70 secured to one another with fasteners 90. The mounting rails can be secured to a cabinet or rack utilizing industry standard design requirements per the CEA-310-E. The overall length of the cable management bracket is adjustable to accommodate various cabinet and rack configurations.

Figure 2:
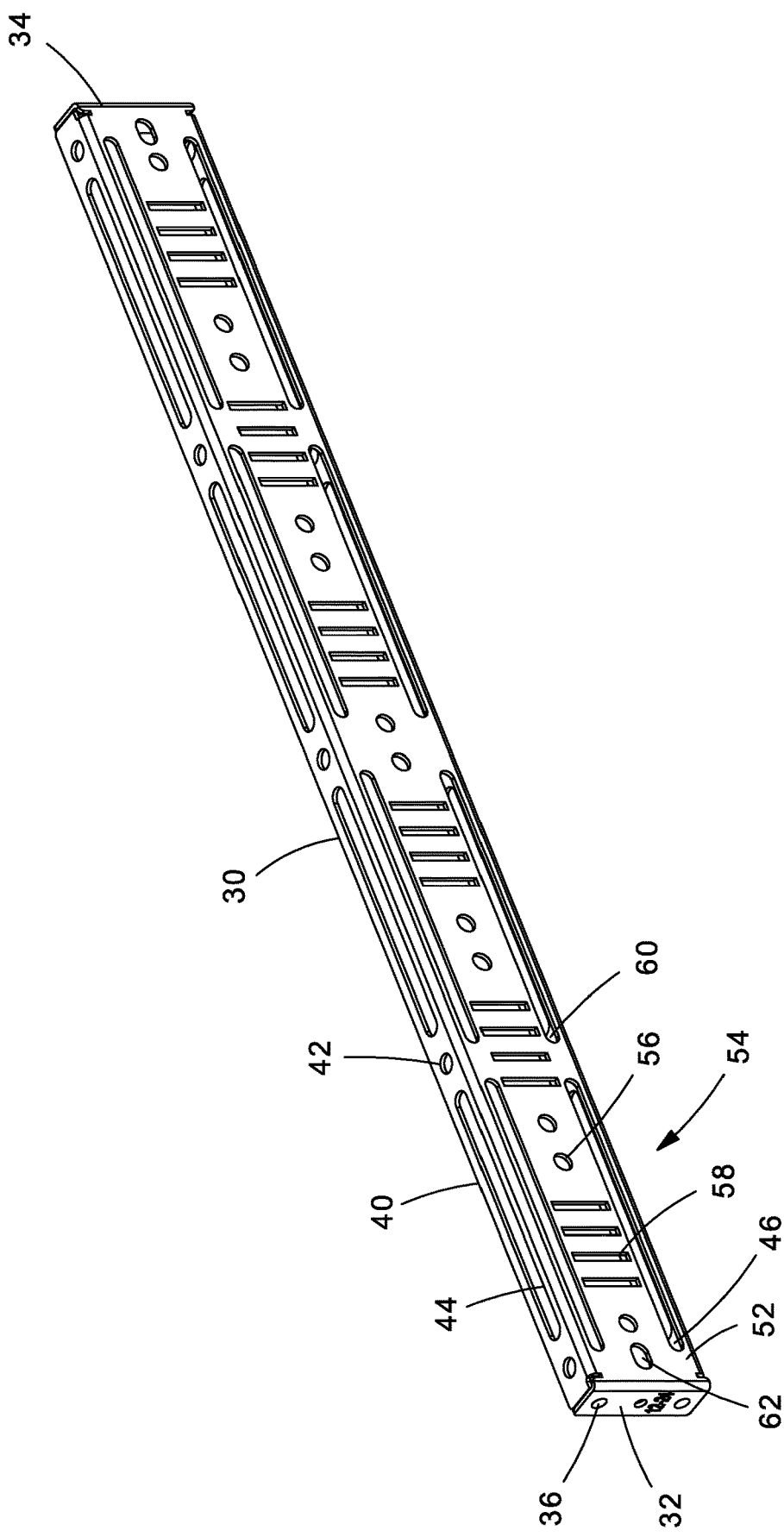
FIG. 2 is a perspective view of the inner mounting rail of the cable management bracket of FIG. 1.

FIG. 2 illustrates the inner mounting rail 30. The inner mounting rail 30 is designed to be a maximum 1RU height (1.75 inches). The inner mounting rail 30 includes end flanges 32, 34, a top flange 40, a bottom flange 46 and a side surface 52. The top flange 40 includes holes 42 and slits 44 and the bottom flange 46 includes holes 48 and slits 50. The inner mounting rail 30 contains a plurality of mounting features 54 along the side surface 52 to secure various bundling clips or cable management clips. The mounting features 54 are arranged in groups including several holes 56 and slots 58. Each mounting feature 54 is designed to secure 12-transition bundling clips, 18-transition bundling clips, wide hook and loop cable ties, or cable harness clips. The inner mounting rail 30 also includes a plurality of slits 60 on the side surface 52 for enabling hook and loop ties to be attached the top and bottom flanges 40, 46, respectively. The slits 60 enable the outer mounting rail 70 to be secured via one or multiple #10-32 screws or nuts. The side surface 52 also includes mounting slots 62 for mounting the inner mounting rail 30 across a 1 RU space.

As illustrated in FIG. 2, the inner mounting rail 30 is a symmetrical design that contains two different mounting configurations. One end flange 32 contains two #12-24 threaded holes 36, while the opposite end flange 34 contains two M6 threaded holes 38. The inner mounting rail 30 can be flipped to expose the desired threaded mounting holes required for mounting to the rack or cabinet.

Figure 3:
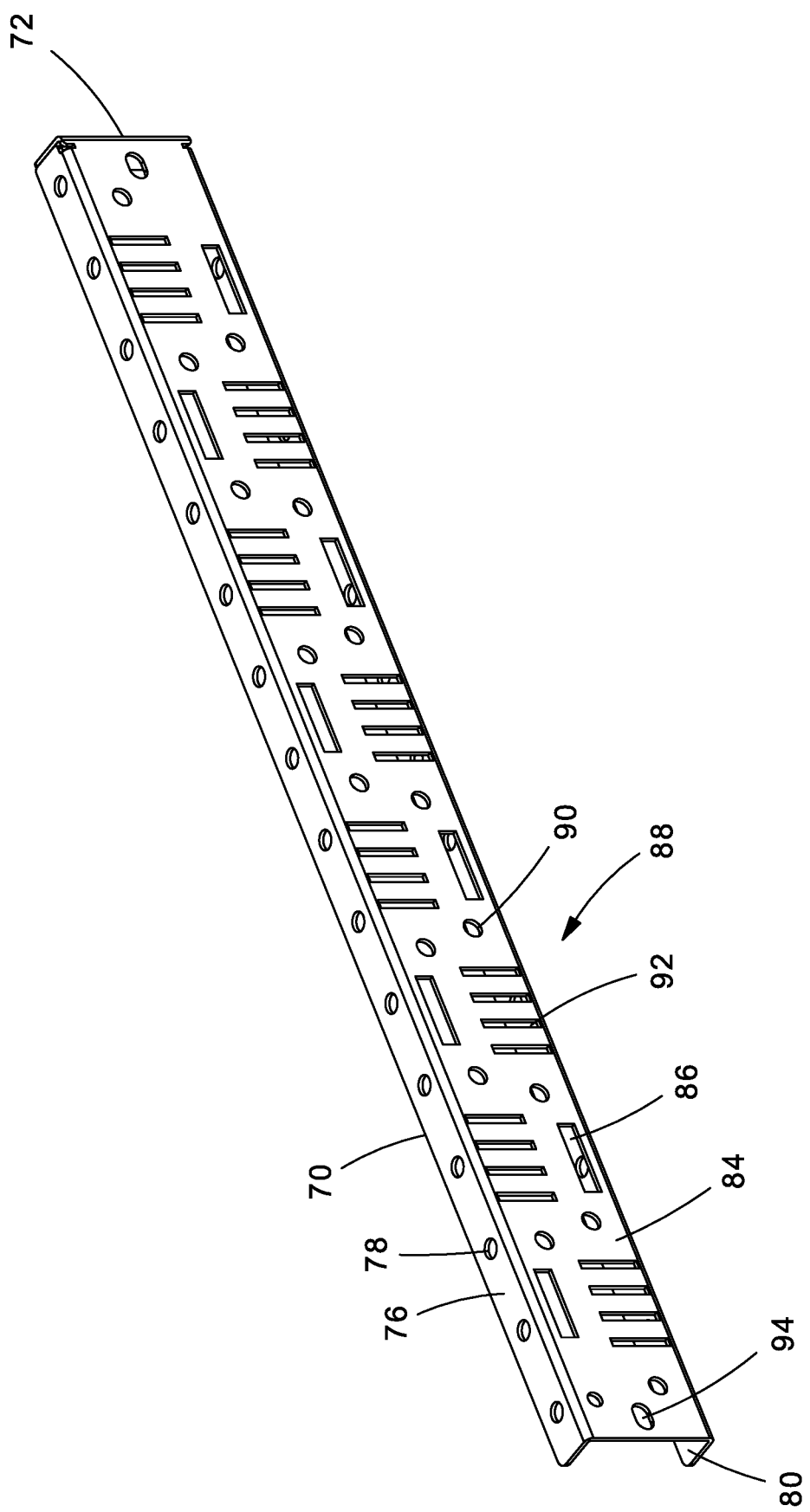
FIG. 3 is a left perspective view of the outer mounting rail of the cable management bracket of FIG. 1.
Figure 4:
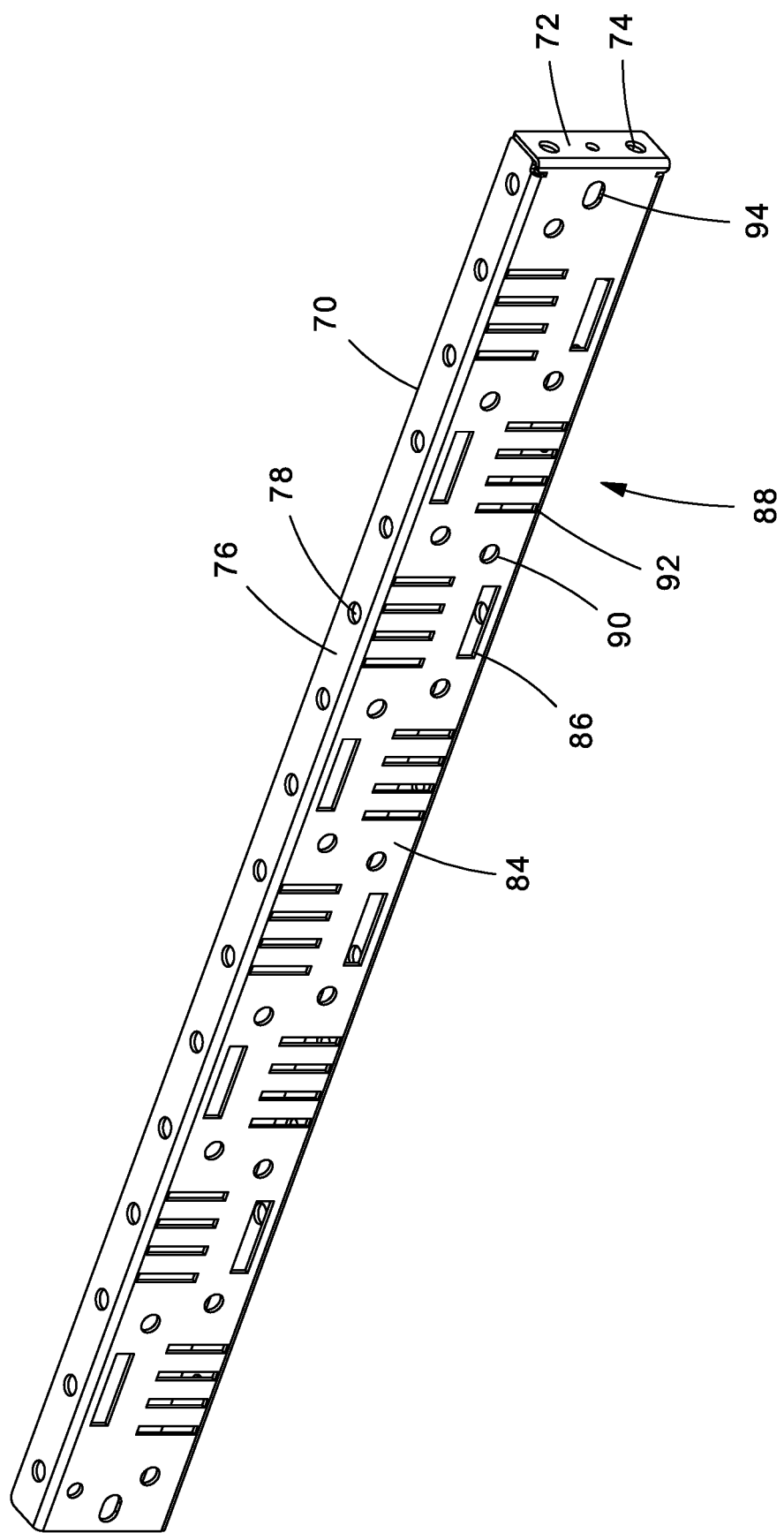
FIG. 4 is a right perspective view of the outer mounting rail of the cable management bracket of FIG. 1.

FIGS. 3 and 4 illustrate the outer mounting rail 70. The outer mounting rail 70 includes a C-shaped cross section to slide over the inner mounting rail 30. The outer mounting rail 70 telescopes along the inner mounting rail 30 to provide a varied, adjustable length cable management bracket. The outer mounting rail 70 includes one end flange 72, a top flange 76, a bottom flange 80 and a side surface 84. As illustrated in FIG. 4, the end flange 72 includes two clearance holes 74. Fasteners (i.e. #12-24 or M6 screws) are secured through the clearance holes 74 for mounting the outer rail 70 to the moveable, rear vertical equipment rail from a cabinet or the rear vertical rails of a 4-post rack.

The top flange 76 includes a plurality of 0.25-inch diameter holes 78 for cable management clips. The side surface 84 includes a plurality of slits 86 to providing an opening for hook and loop ties to be attached across the top and bottom flanges 76, 80, respectively. The slits 86 also enable one or multiple #10-32 screws or nuts to secure the outer mounting rail 70 to the inner mounting rail 30. The side surfaces 84 also include a plurality of mounting features 88 along the side surface 84 to secure various bundling clips or cable management clips. The mounting features 88 are arranged in groups including several holes 90 and slots 92. The mounting feature group 88 is designed to secure 12-transition bundling clips, 18-transition bundling clips, wide hook and loop ties, or cable harness clips. The side surface also includes industry standard 1RU mounting slots for mounting the outer mounting rail across a 1 RU space.

Figure 5:
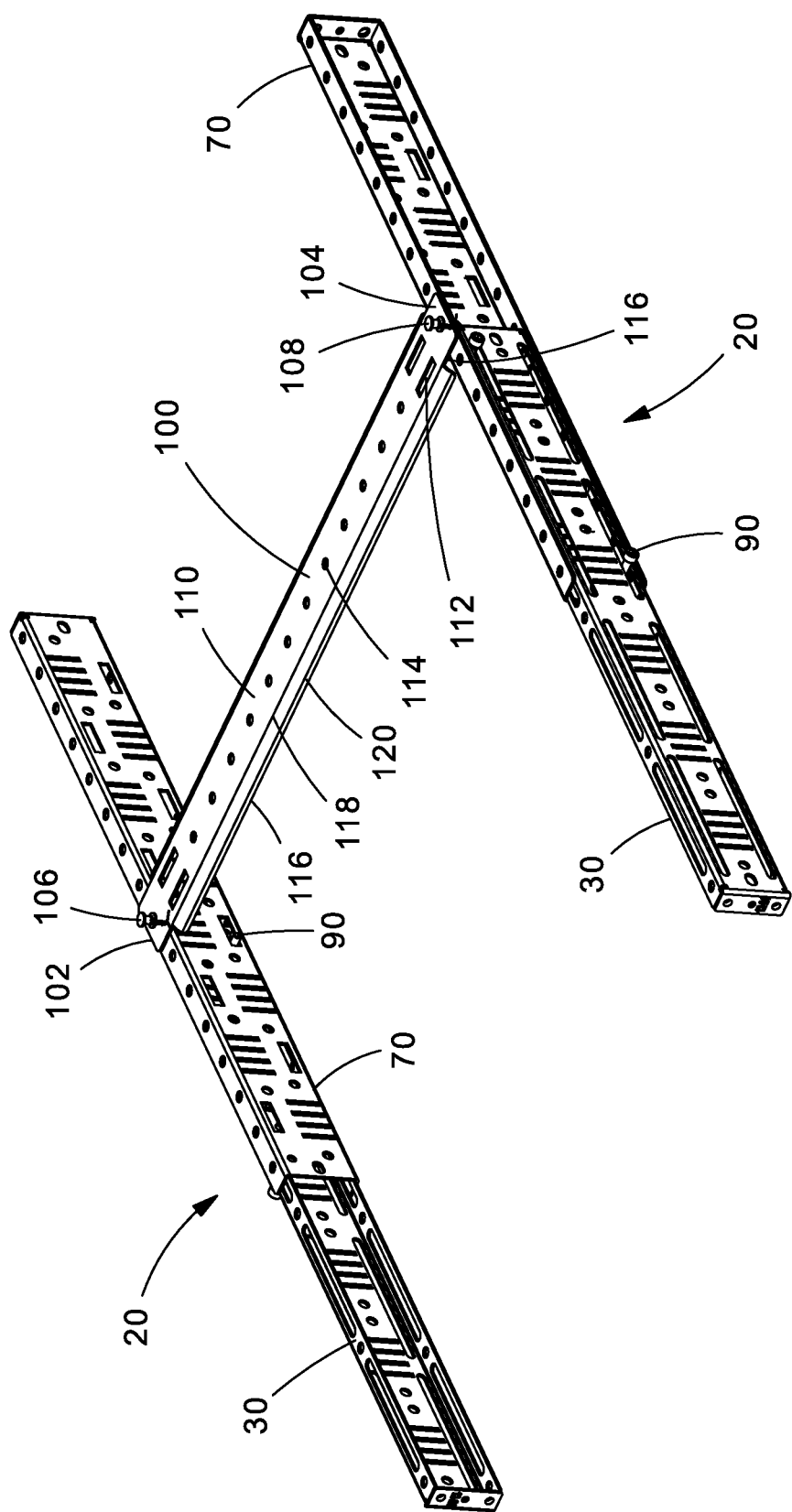
FIG. 5 is a perspective view of cable management brackets of FIG. 1 and a cable strain relief bracket.

FIG. 5 illustrates two expandable cable management brackets 20 and a strain relief bracket 100 positioned between the cable management brackets 20. The strain relief bracket 100 includes ends 102, 104, a top 110, a bottom 116, and sides 118. The ends 102, 104 include rivets 106, 108, or other fastener, to secure the strain relief bracket 100 to the cable management brackets 20. The top 110 of the strain relief bracket includes slots 112 and mounting holes 114. The slots 112 receive hook and loop ties to enable installed cables to be routed from the sides of the enclosures. The mounting holes 114 receive mounting clips. The sides 118 of the strain relief bracket 100 include radiused spillways 120 for the bend radius control of the installed cables.

The left and right cable management brackets are designed to mount to a rack or cabinet as described above. The cable strain relief bracket mounts to the left and right cable management brackets via rivets or a plunger and grommet fasteners. The cable strain relief bracket can be mounted along the plurality of round holes found on the inner and outer mounting rails. This configuration allows for maximum cable management flexibility behind a patch panel or enclosure.

The CEA-310-E specification establishes the guidelines for rack and cabinet mounting of equipment in the RU space. The standard specifies rack and cabinet width and depth, as well as the minimum clearances between mounting flanges.

The left and right cable management brackets are secured to a cabinet or a 4-post rack having a preferred width of 19 inches across the outside of the rail assemblies. This distance ensures that the cable management brackets illustrated in FIG. 5 fit inside industry standard cabinets and racks as the minimum dimension of the cabinet or rack opening per CEA-310-E is 19.031 inches. The preferred width across the inside of the cable management brackets is 17.75 inches. This distance ensures that the cable management brackets can be secured to a rack or cabinet when enclosures, patch panels, or other equipment are installed across the RU space.

Since the brackets telescope relative to one another, the lengths of the mounting rails forming the cable management bracket are a minimum of 19.38 inches to a maximum of 37.75 inches. This variable length provides compatibility with all rack and cabinet depths up to 800 mm deep.

Figure 6:
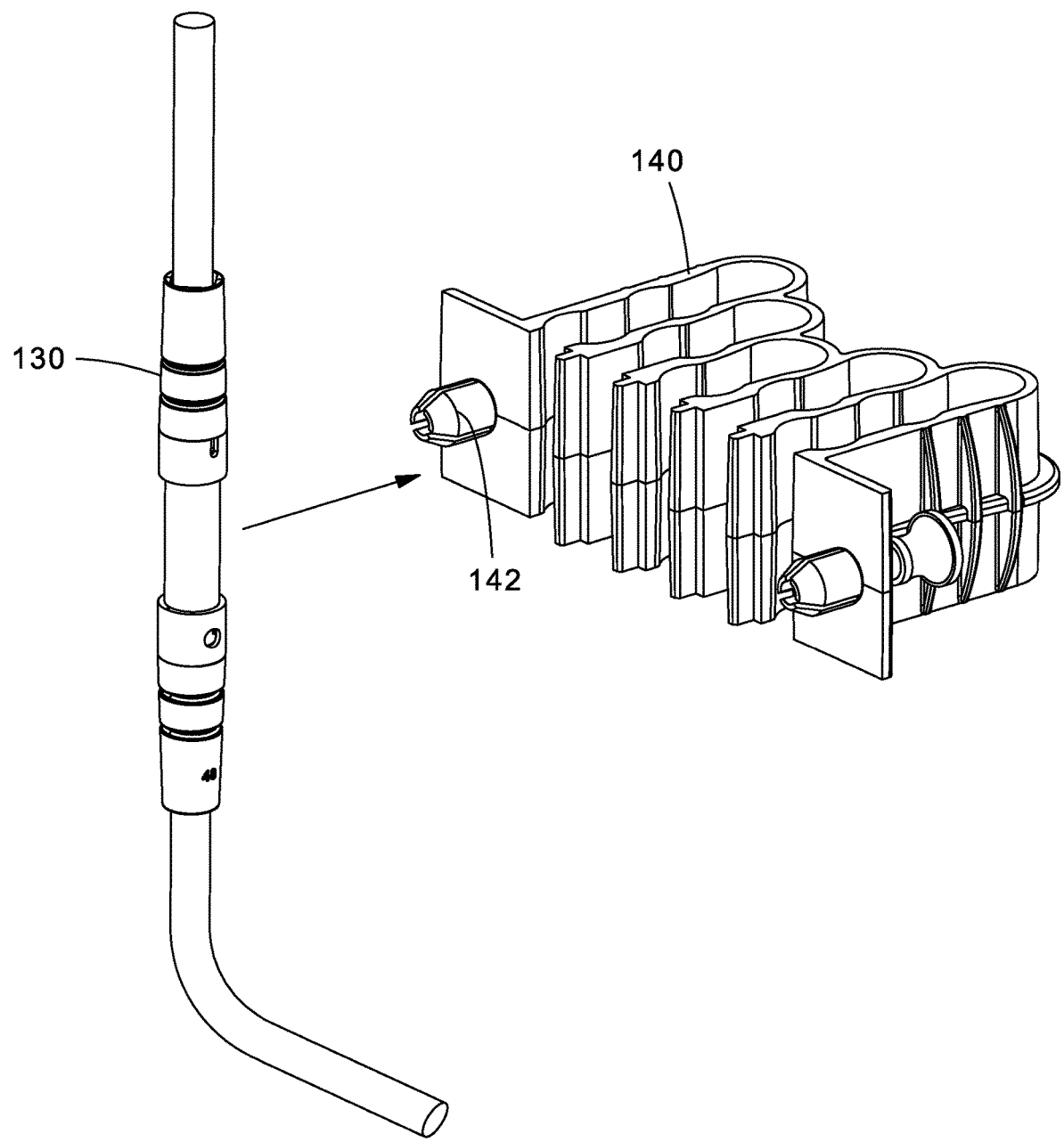
FIG. 6 is a perspective view of a cable transition and cable transition bracket.
Figure 7B:
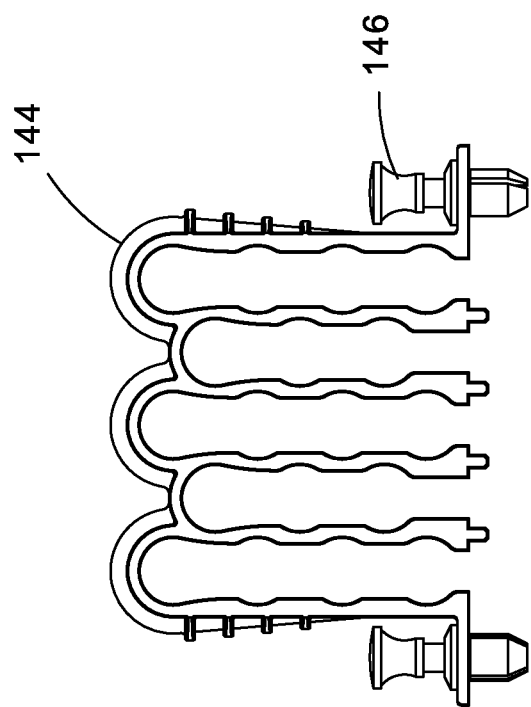
FIG. 7B is a perspective view of an 18-position cable transition bracket.
Figure 7A:
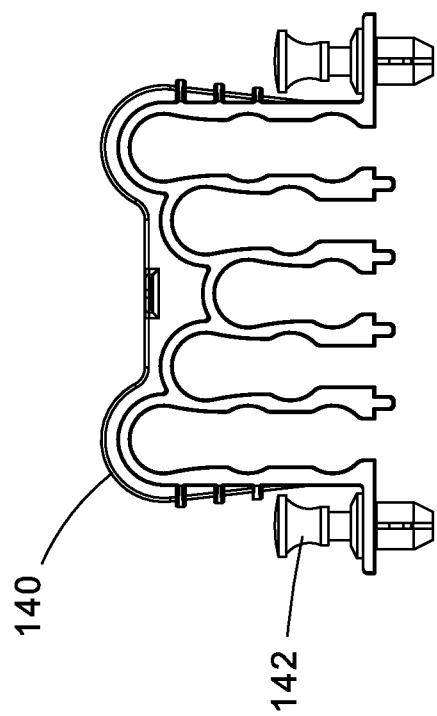
FIG. 7A is a perspective view of a 12-position cable transition bracket of FIG. 6.

As discussed above, the inner and outer mounting rails 30, 70 contain group mounting features 54, 88, respectively, to mount various high-density fiber enclosure (HDFE) fiber trunk cable bundling clips. FIGS. 6, 7A, and 7B illustrate various fiber trunk cable bundling clips. The molded HDFE cable transitions 130 from the HDFE fiber optic cables snap into the cable transition bundling clips 140, 144. A total of twelve cable transitions fit into the 12-position bundling clip 140 (FIG. 7A) and eighteen cable transitions fit into the eighteen-position bundling clip 144 (FIG. 7B). Two plunger and grommet fasteners 142, 146, snap into holes in the bundling clips 140, 144, respectively, to attach the bundling clips to the inner and outer mounting rails 30, 70 (see FIG. 8). The transition bundling clips secured to the inner and outer mounting rails 30, 70 reduces physical stresses in the cable fibers by supporting the weight of the cables.

Figure 8:
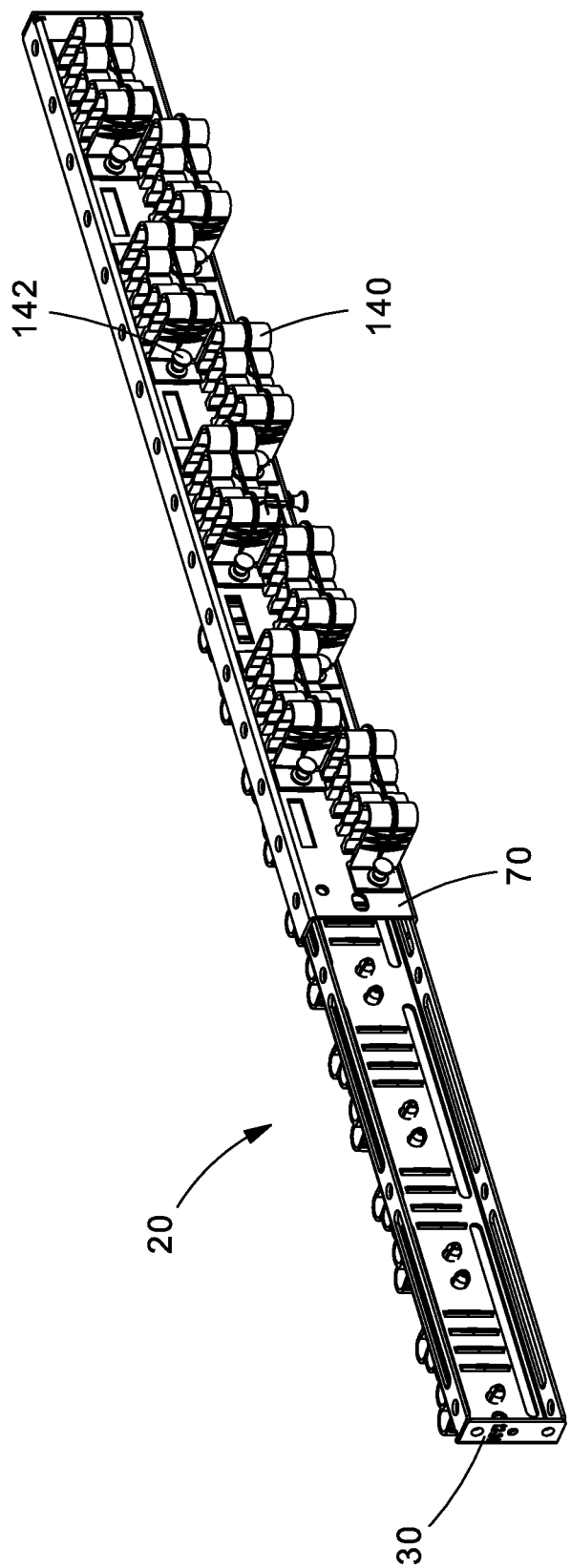
FIG. 8 is a perspective view of the cable management bracket of FIG. 1 with a plurality of cable transition brackets secured thereto.
Figure 9:
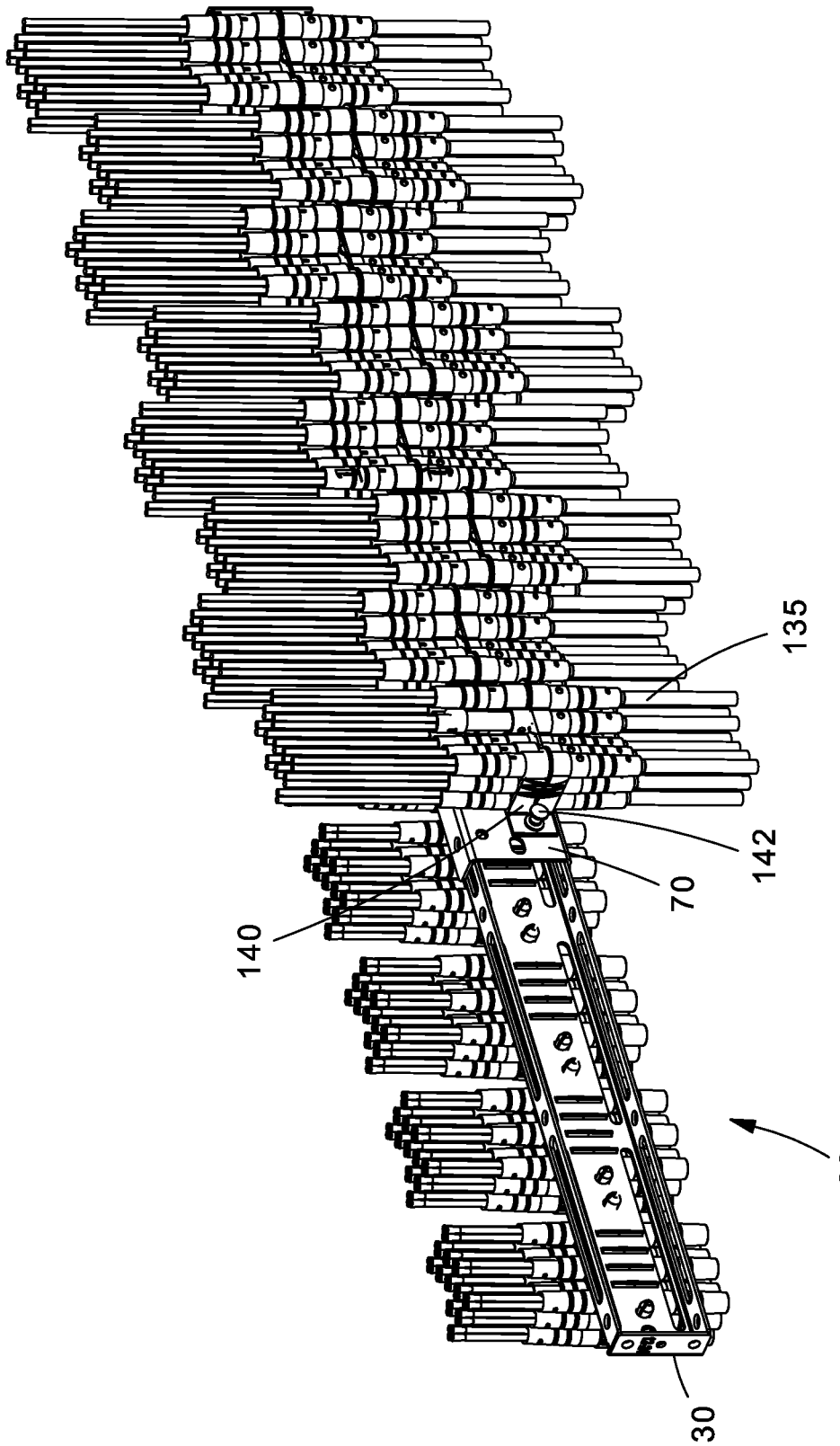
FIG. 9 is a perspective view of the cable management bracket of FIG. 8 with a plurality of cable transition brackets populated with cables secured thereto.

As illustrated in FIGS. 8 and 9, an array of transition bundling clips 140 can be secured to the inner and outer mounting rails 30, 70. FIG. 9 illustrates the bundling clips 140 supporting a plurality of HDFE fiber optic cables 135. Each HDFE fiber optic cable can contain twelve, twenty-four, thirty-six, or forty-eight fibers. As illustrated in FIG. 9, the maximum quantity of 12-position bundling clips 140 is installed in the cable management bracket 20. There is a total of 168 transitions secured to the inner and outer rails via the bundling clips. If 18-position bundling clips were used instead, a maximum of 252 transitions can be secured.

Figure 10:
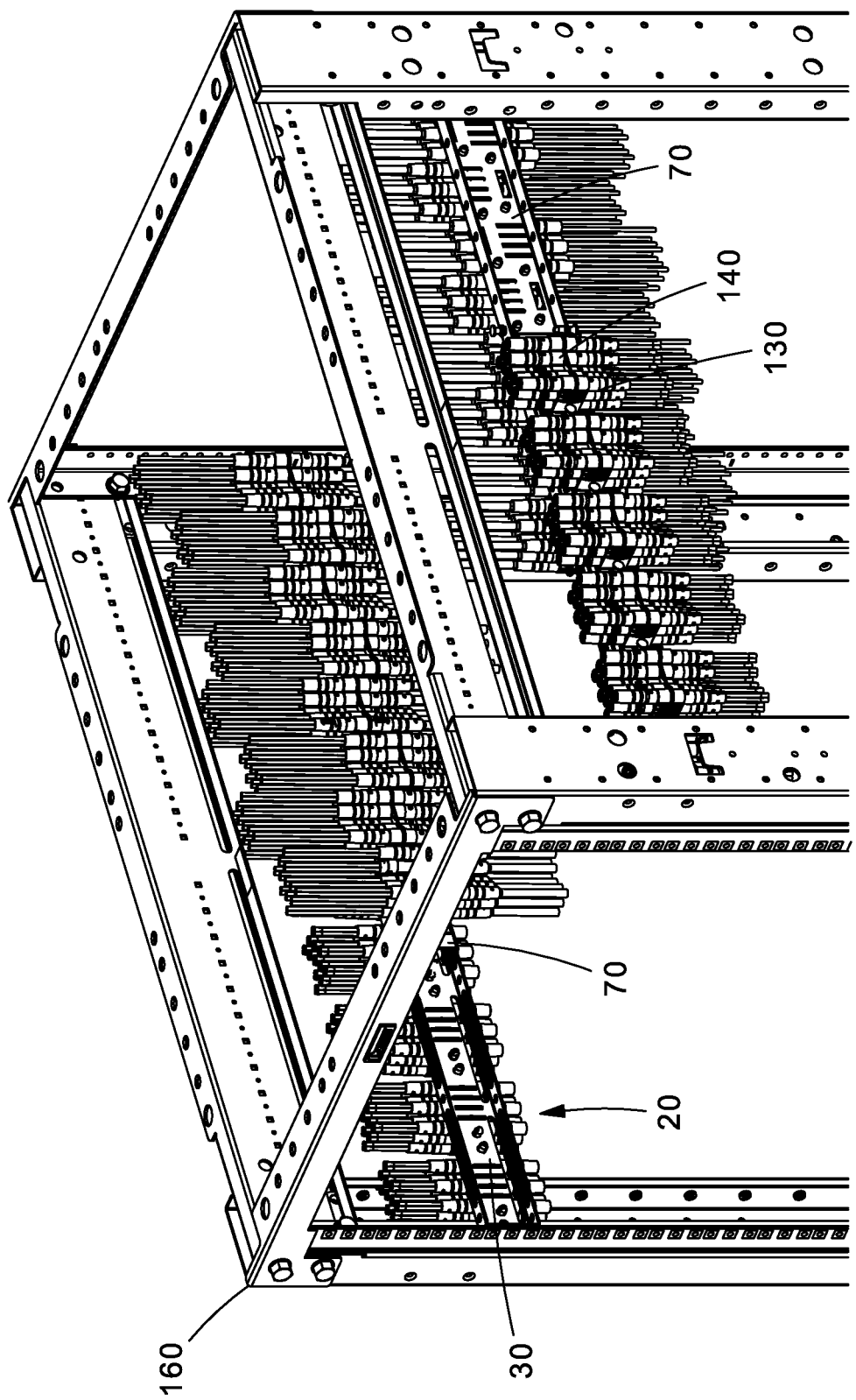
FIG. 10 is a perspective view of the cable management bracket of FIG. 9 secured in a 4-post rack.

FIG. 10 illustrates two cable management brackets 20 with bundling clips 140 installed in a 4-post 30-inch deep rack 160. One cable management bracket 20 is secured to the left side of the rack 160 and one cable management bracket 20 is secured to the right side of the rack 160.

As illustrated in FIG. 10, a total of 14 12-position bundling clips 140 mounted along the left cable management bracket 20. Each 12-position bundling clip 140 holds a total of 168 transitions with each transition holding a total of 48 fibers. As a result, a total of 8,064 fibers are held in the bundling clips 140. Since there are two populated cable management brackets 20 secured to the 4-post rack 160, there would be a total of 336 transitions and 16,128 fibers in a single rack unit (1RU). If the 18-position bundling clips 144 were used instead, that there would be a total of 252 transitions per side, amounting to a total of 12,096 fibers. Therefore, with two populated cable management brackets 20 there would be a total of 504 transitions and 24,192 fibers managed in a single rack unit (1 RU).

The cable transition 130 must be secured into a bundling clip 140 at a location in the rack or cabinet that allows the trunk cable to be properly routed or managed. The cable transition must also be secured at a location that allows the connector ends of the trunk cable to properly mate into a fiber optic adapter which may be found in a fiber optic module or cassette or fiber adapter panel. The typical breakout length from a cable transition to the connector end of a trunk cable is typically 39 inches. For the full capacity of fibers to be properly routed to patch panels or enclosures, trunk cable with varied breakout lengths could be used, if desired.

Figure 11:
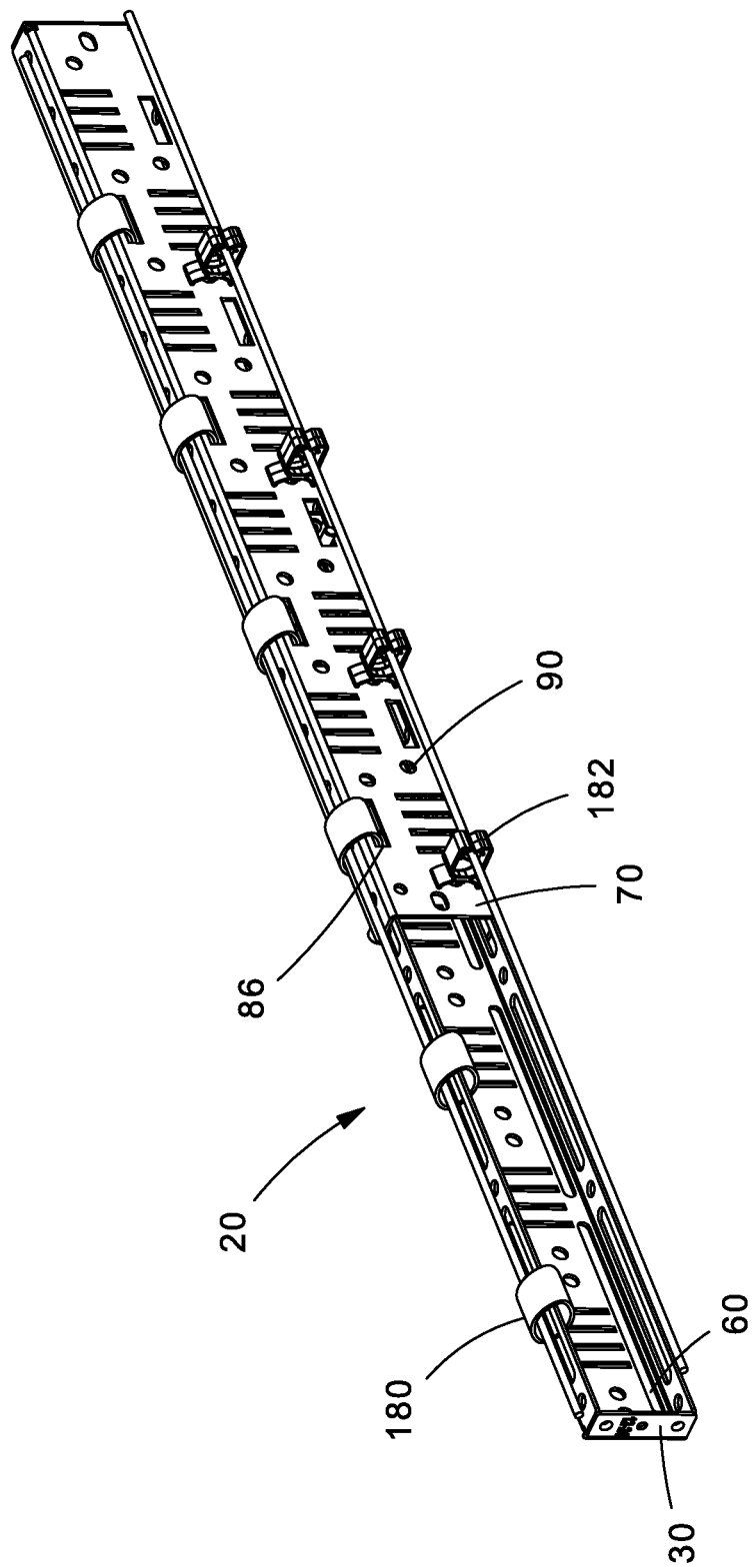
FIG. 11 is a perspective view of the cable management bracket of FIG. 1 with a plurality of hook and loop ties and cable management clips secured thereto.

FIG. 11 illustrates the cable management bracket of the present invention with hook and loop ties 180 and cable management clips 182. Cables can be secured to the top of the inner or outer mounting rails 30, 70 with a 0.75-inch-wide hook and loop ties 180. The hook and loop ties 180 are mounted through the slits 60, 86 in the mounting rails 30, 70. The inner and outer mounting rails 30, 70 may also receive cable management clips 182.

Figure 12:
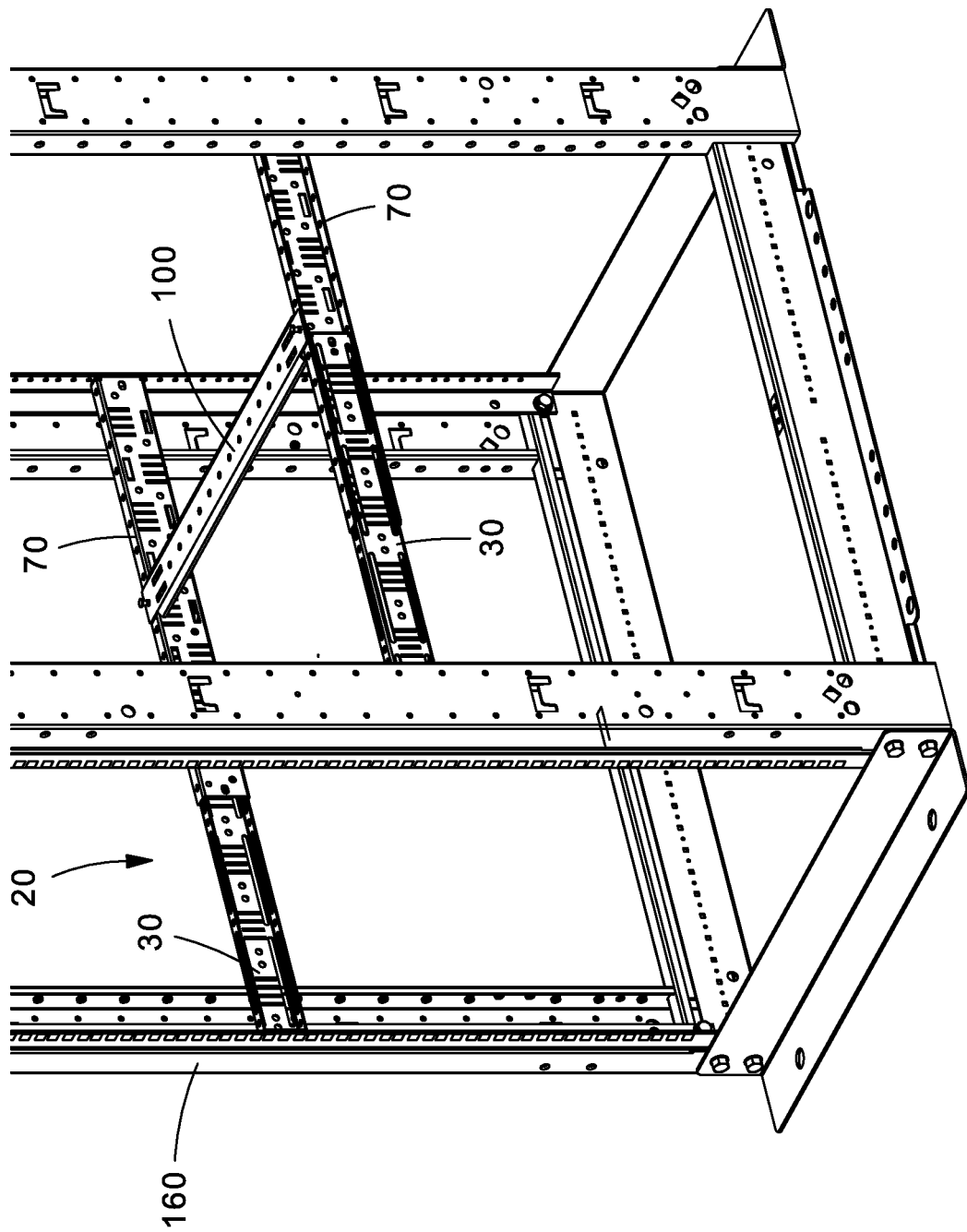
FIG. 12 is a perspective view of the cable management bracket of FIG. 5 secured to a 4-post rack.

FIG. 12 illustrates cable management brackets 20 and a strain relief bracket 100 installed in a 4-post, 30-inch rack 160. The cable management bracket 20 provides an open chassis solution at the rear of the enclosure for easier access to cabling. Since the cable management bracket 20 is expandable, the outer rails 70 can be secured to the inner rails 30 in various configurations to provide multiple overall lengths. Due to the adjustable length, the cable management bracket 20 can be used with various 4-post rack configuration depths, such as 23-inches, 30-inches, and 36 inches.

Figure 13:
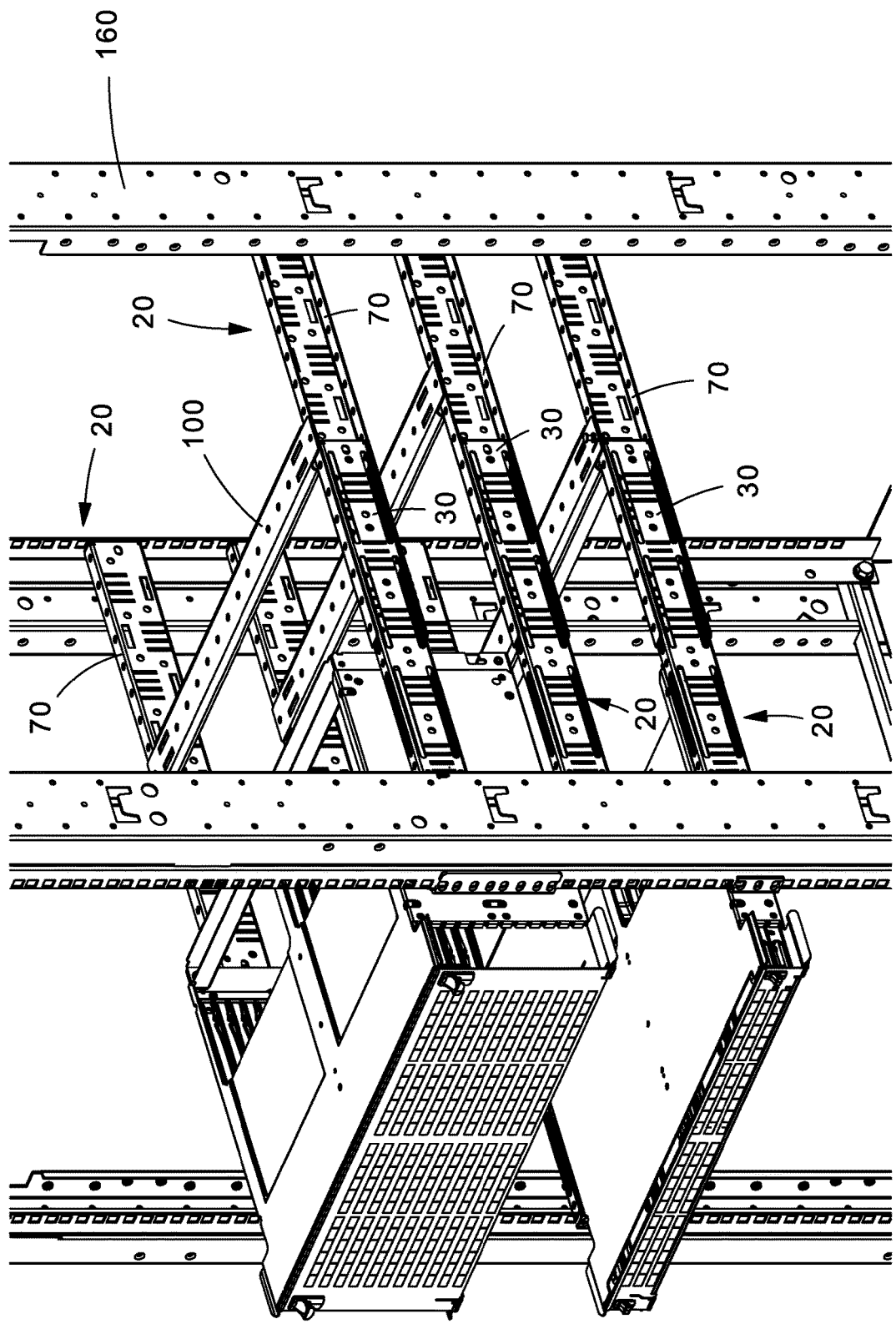
FIG. 13 is a perspective view of a plurality of cable management brackets of FIG. 5 secured to a 4-post rack.

FIG. 13 illustrates multiple cable management brackets 20 and strain relief brackets 100 secured to a 4-post rack 160 adjacent to an HDFE 1 RU enclosure and a HDFE 4 RU enclosure. The enclosures are compatible because the cable management brackets 20 do not encroach the CEA industry-standard 1 RU mounting space. As discussed above, the strain relief bracket 100 mounts to the left and right cable management brackets 20 by utilizing a plunger and grommet fasteners in the plurality of holes 42, 78 in the inner and outer mounting rails 30, 70, respectively. The strain relief bracket 100 secured to the cable management brackets 20 support cabling at the rear of the enclosure.

FIGS. 14A and 14B illustrate routing of cables 135 along the strain relief bracket 100 at the rear of the enclosure. Hook and loop ties 180 are used to secure the trunk cables to the cable strain relief bracket 100. A slack loop is created for all incoming trunk cables, as illustrated in FIGS. 14A and 14B. The slack loop is required to allow movement of the trays from the front of the enclosure. For split routing of cables (FIG. 14A), a minimum of 28 inches of slack is required from the rear of the installed enclosure cassette or fiber adapter panels to the tie down points. When routing cables all to one side (FIG. 14B), a minimum of 32 inches of slack is required from the far side of the enclosure to the tie down point.

Figure 15:
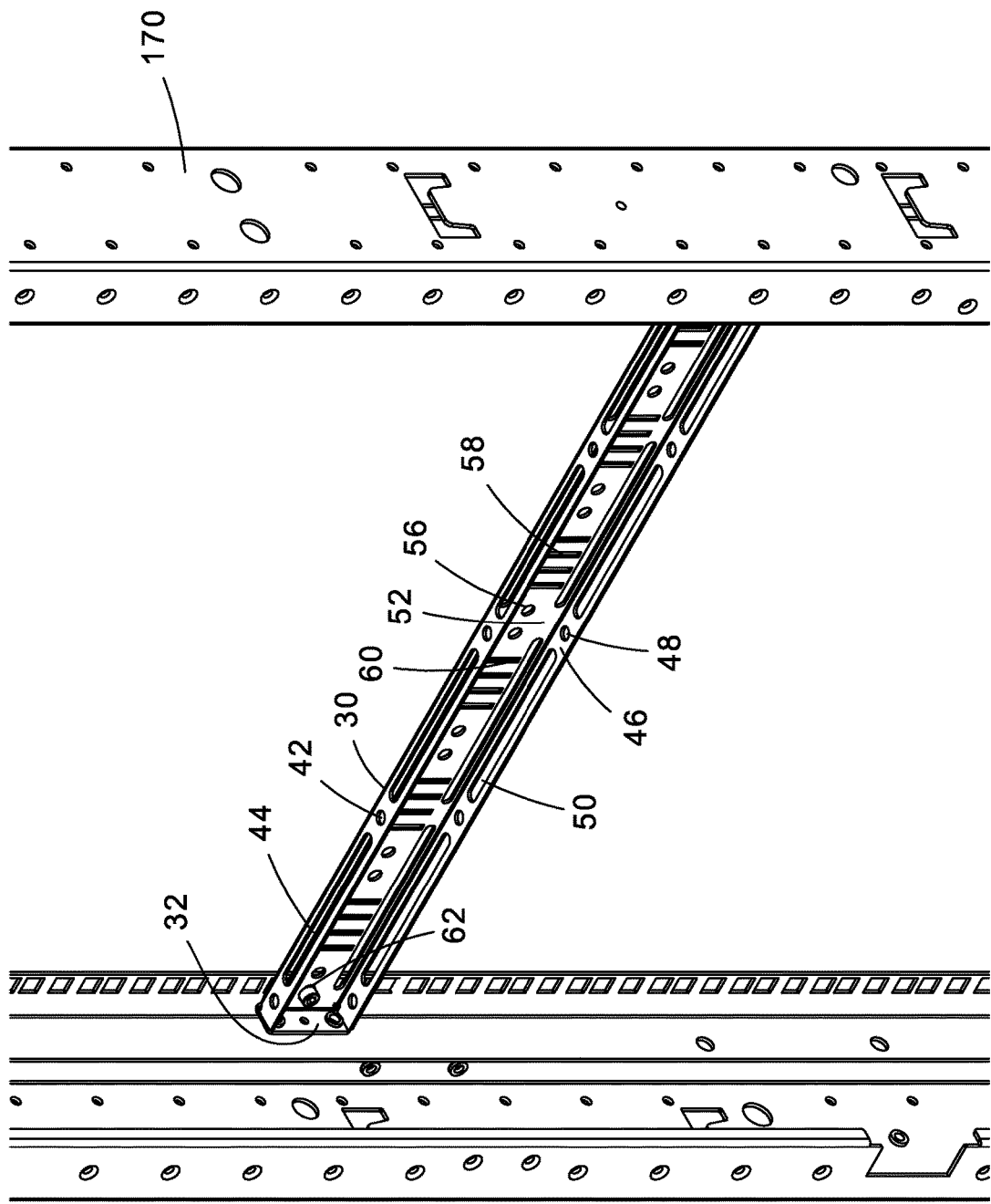
FIG. 15 is a perspective view of the inner mounting rail of FIG. 2 secured in a rack.

FIG. 15 illustrates another embodiment using the inner mounting rail 30 of the present invention. The inner mounting rail 30 is secured to a rack or cabinet across the 1RU space. Two screws are installed into the mounting slots across either side of the inner mounting rail and into the threaded holes or cage nuts of a rack or cabinet. This embodiment is beneficial when securing cables that enter from the top or bottom of a rack or cabinet. Cables can be secured to the inner mounting rail 30 with 0.75-inch-wide hook and loop ties through the slits 60 or cable management clips positioned in the mounting holes 56.

Figure 16:
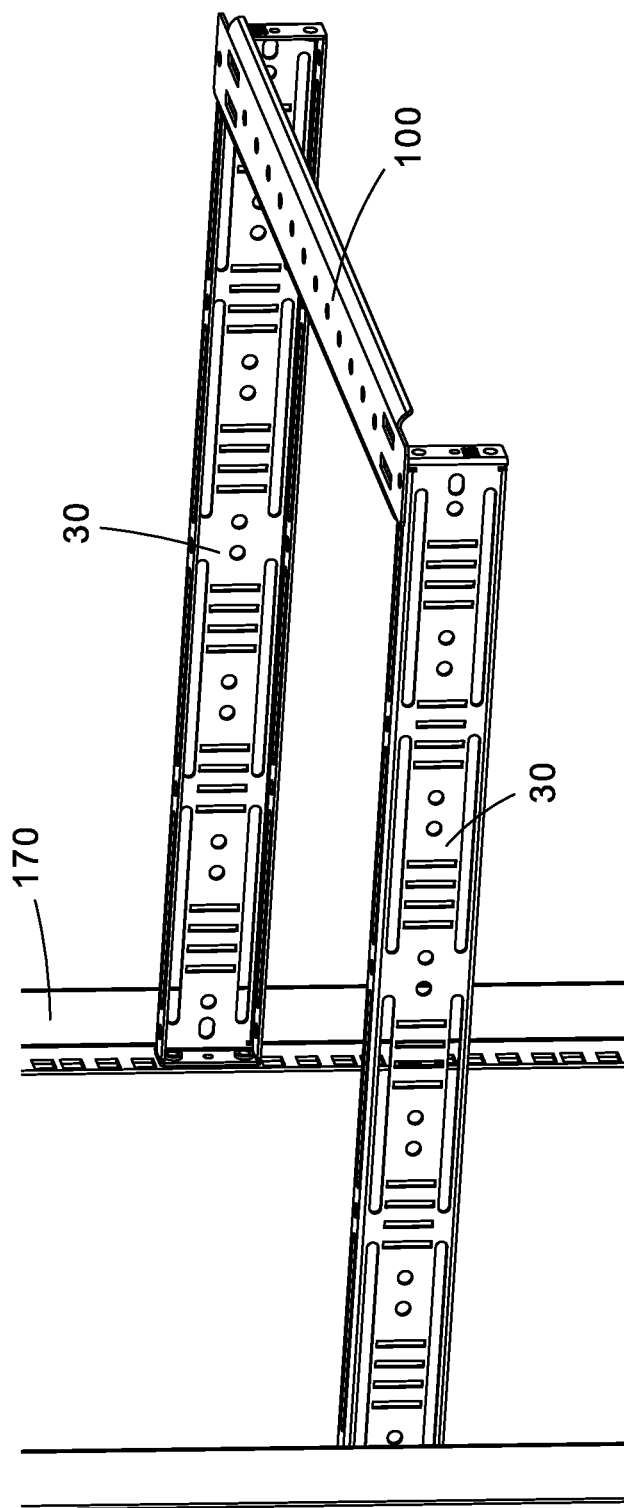
FIG. 16 is a perspective view of an alternative cantilevered embodiment of the mounting rail of FIG. 2 secured to a 2-post rack.

FIG. 16 illustrates another embodiment using inner mounting rails 30 and the strain relief bracket 100. Two inner mounting rails 30 are secured to a two-post rack 170. A strain relief bracket 100 is secured to the opposite end of the inner mounting rails 30 to create a cantilevered embodiment.

Figure 17:
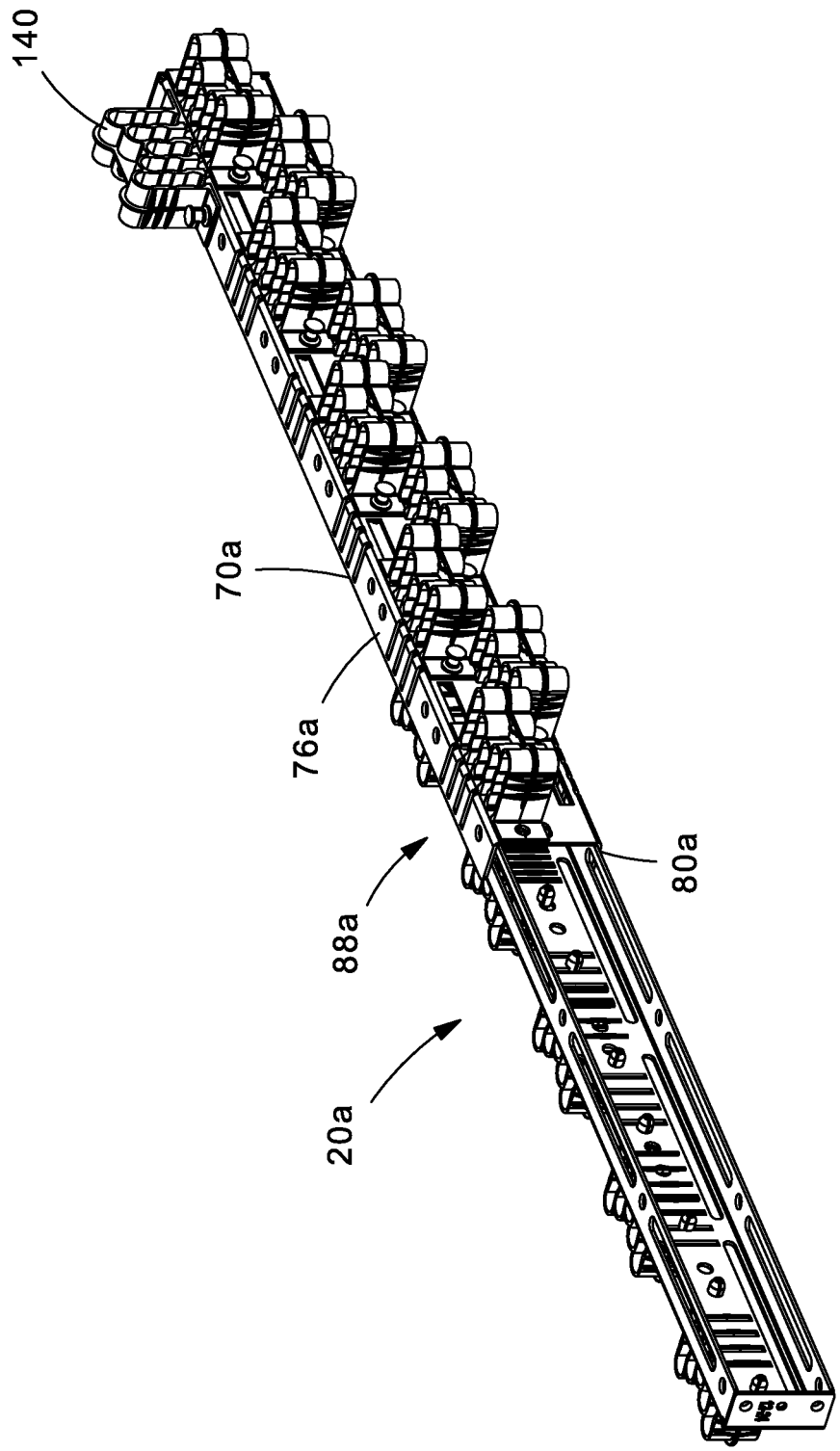
FIG. 17 is an alternative embodiment of the cable management bracket of FIG. 1 with wider mounting rails.

The width of the inner mounting rail 30 and the outer mounting rail 70 of the cable management bracket 20 was designed to fit within a 19-inch cabinet or rack width configuration. The cable management bracket 20 has a low 1 RU height profile, allowing greater access to components in the internal rack or cabinet space. It is also desirable to provide wider inner and outer rails. FIG. 17 illustrates a wider cable management bracket 20*a*. The outer mounting rails 70*a* includes mounting groups 88*a* along the top and bottom flanges 76*a*, 80*a* to support additional bundling clips. Only a single 12-position bundling clip 140 is illustrated in FIG. 17, however, a plurality of the bundling clips can be secured across the top and bottom flanges 76*a*, 80*a*, as desired.

The cable management bracket of the present invention is compatible with all industry standard cabinets and four post racks. The cable management brackets and the strain relief bracket are manufactured from steel and are power coated with a slight texture. The cable management brackets and strain relief bracket contain various mounting holes of various diameters for use with many cable management accessories.

The cable management bracket is a low-cost embodiment that can be utilized when it is necessary to guide fiber optic or copper cabling along the outer sides of a cabinet or rack and it is not necessary to route the cables from the rear of an enclosure or patch panel.

Furthermore, while the preferred embodiments of the present invention have been shown and described, it will be obvious to those skilled in the art that changes, and modifications may be made without departing from the teaching of the invention. The matter set forth in the foregoing description and accompanying drawings is offered by way of illustration only and not as limitation.

The invention claimed is:

1. A cable management bracket for routing cables, the cable management bracket comprising:
    an inner mounting rail having a top flange, at least one end flange, a bottom flange, and a side surface;
    an outer mounting rail secured to the inner mounting rail by fasteners, the outer mounting rail having a top flange, an end flange, a bottom flange, and a side surface;
    wherein the top flange of the inner mounting rail having holes and slits and the bottom flange of the inner mounting rail having holes and slits; and
    wherein the side surface of the inner mounting rail having a plurality of mounting features for securing devices that receive a plurality of cables and the side surface of the outer mounting rail having a plurality of mounting features to secure devices that receive a plurality of cables.

2. The cable management bracket of claim 1, wherein the mounting features of the inner mounting rail are arranged in groups including a plurality of slots and a plurality of holes, the slots extend between the top flange and the bottom flange of the inner mounting rail.

3. The cable management bracket of claim 1, wherein the side surface of the inner mounting rail having a plurality of slits for enabling hook and loop ties to be attached to the top and bottom flanges of the inner mounting rail.

4. The cable management bracket of claim 1, wherein the side surface of the outer mounting rail having a plurality of slits.

5. The cable management bracket of claim 1, wherein the mounting features of the outer mounting rail are arranged in groups including a plurality of slots and a plurality of holes, the slots extend between the top flange and the bottom flange of the outer mounting rail.

6. The cable management bracket of claim 1, wherein the devices are at least one of a bundling clip, a hook and loop tie, and a cable harness clip.

7. A cable management assembly for routing cables within a cabinet, the cable management assembly comprising a first cable management bracket and a second cable management bracket;
wherein the first cable management bracket has an inner mounting rail having a top flange, at least one end flange, a bottom flange, and a side surface; and an outer mounting rail secured to the inner mounting rail by fasteners, the outer mounting rail having a top flange, an end flange, a bottom flange, and a side surface;
wherein the second cable management bracket has an inner mounting rail having a top flange, at least one end flange, a bottom flange, and a side surface; and an outer mounting rail secured to the inner mounting rail by fasteners, the outer mounting rail having a top flange, an end flange, a bottom flange, and a side surface; and
wherein the first cable management bracket is secured to a first side of the cabinet and the second cable management bracket is secured to a second side of the cabinet, wherein a strain relief bracket extends between the first cable management bracket and the second cable management bracket.

8. The cable management assembly of claim 7, wherein the side surface of each inner mounting rail of the first and second cable management brackets having a plurality of mounting features arranged in groups for securing devices that receive a plurality of cables and the side surface of each outer mounting rail of the first and second cable management brackets having a plurality of mounting features arranged in groups to secure devices that receives a plurality of cables.

9. The cable management assembly of claim 8, wherein the devices are at least one of a bundling clip, a hook and loop tie, and a cable harness clip.

10. The cable management assembly of claim 8, wherein the mounting features of each inner mounting rail of the first and second cable management brackets include a plurality of slots and a plurality of holes, the slots extend between the top flange and the bottom flange of the inner mounting rails; and wherein the mounting features of each outer mounting rail of the first and second cable management brackets include a plurality of slots and a plurality of holes, the slots extend between the top flange and the bottom flange of the outer mounting rails.

11. The cable management assembly of claim 7, wherein the outer mounting rails of the first and second cable management brackets having a C-shaped cross section to slide over the inner mounting rails of the first and second cable management brackets, wherein the outer mounting rails telescope along the inner mounting rails providing adjustable length cable management brackets.

12. The cable management assembly of claim 7, wherein the strain relief bracket having a first end, a second end, a top, a bottom, and sides with radiused spillways for bend radius control; and wherein the first end of the strain relief bracket is secured to the outer mounting rail of the first cable management bracket and the second end of the strain relief bracket is secured to the outer mounting rail of the second cable management bracket.

13. The cable management assembly of claim 7, wherein cables are routed along the inner mounting rails and the outer mounting rails of the first and second cable management brackets.

14. A cable management bracket for routing cables, the cable management bracket comprising:
an inner mounting rail having a top flange, at least one end flange, a bottom flange, and a side surface;
an outer mounting rail secured to the inner mounting rail by fasteners, the outer mounting rail having a top flange, an end flange, a bottom flange, and a side surface, wherein the outer mounting rail having a C-shaped cross section to slide over the inner mounting rail, wherein the outer mounting rail telescopes along the inner mounting rail providing an adjustable length cable management bracket; and
wherein the side surface of the inner mounting rail having a plurality of mounting features for securing devices that receive a plurality of cables and the side surface of the outer mounting rail having a plurality of mounting features to secure devices that receive a plurality of cables.

15. A cable management bracket for routing cables, the cable management bracket comprising:
an inner mounting rail having a top flange, at least one end flange, a bottom flange, and a side surface;
an outer mounting rail secured to the inner mounting rail by fasteners, the outer mounting rail having a top flange, an end flange, a bottom flange, and a side surface;
wherein the top flange of the outer mounting rail having a plurality of holes and the bottom flange of the outer mounting rail having a plurality of holes; and
wherein the side surface of the inner mounting rail having a plurality of mounting features for securing devices that receive a plurality of cables and the side surface of the outer mounting rail having a plurality of mounting features to secure devices that receive a plurality of cables.

* * * * *